United States Patent [19]

Chang et al.

[11] 4,159,215

[45] Jun. 26, 1979

[54] DROPLET MIGRATION DOPING USING REACTIVE CARRIERS AND DOPANTS

[75] Inventors: Mike F. Chang, Liverpool; Harvey E. Cline; Thomas R. Anthony, both of Schenectady, all of N.Y.

[73] Assignee: General Electric Company, Schenectady, N.Y.

[21] Appl. No.: 944,278

[22] Filed: Sep. 21, 1978

[51] Int. Cl.² .......................................... H01L 21/228
[52] U.S. Cl. ..................................... 148/1.5; 148/171; 148/178; 148/188
[58] Field of Search .................. 148/1.5, 171, 178, 188

[56] References Cited

U.S. PATENT DOCUMENTS

| 2,813,048 | 11/1957 | Pfann | 75/65 ZM |
| 3,988,766 | 10/1976 | Anthony et al. | 148/188 X |
| 4,001,047 | 1/1977 | Boah | 148/1.5 |

OTHER PUBLICATIONS

*J. of App. Physics,* vol. 48, No. 6, Jun. 1977, pp. 2196–2201.

*Primary Examiner*—G. Ozaki
*Attorney, Agent, or Firm*—Donald M. Winegar; Joseph T. Cohen; Charles T. Watts

[57] ABSTRACT

Aluminum is employed as a carrier metal for antimony in order to N-type dope semiconductor material by temperature gradient zone melting (TGZM) processing.

6 Claims, 5 Drawing Figures

DROPLET MIGRATION DOPING USING REACTIVE CARRIERS AND DOPANTS

BACKGROUND OF THE INVENTION

1. Field of the Invention

This invention relates to a method of migrating an alloy melt of a carrier metal and passenger element elected for its doping characteristics through a solid body of semiconductor material by thermal gradient zone melting (TGZM) and, in particular, to the case where the carrier metal and its passenger element react to form an inert stable compound that make the combination of the particular carrier metal and passenger element generally unsuitable for TGZM.

2. Description of the Prior Art

W. G. Pfann in U.S. Pat. No. 2,739,088 and 2,813,048 describes methods of migrating melts of metal through particular regions of a solid body of semiconductor material by thermal gradient zone melting.

Although aluminum has been the predominant metal migrated by TGZM, one needs configurations other than P+N type diodes and the like in devices. Unfortunately, many other elements used in doping semiconductor materials either have too high a vapor pressure or too slow a rate of migration when employed in TGZM processing.

In particular, the N-type dopants; namely, phosphorus, arsenic, and antimony, have a high vapor pressure at the processing temperatures of 700° C. to 1350° C. normally used for temperature gradient zone melting. Their high vapor pressures cause evaporation of these N-type elements before such elements in the form of an alloy melt with the material of the semiconductor body can penetrate into and encapsulate themselves in the body of semiconductor to prevent subsequent evaporation.

One means of avoiding this evaporation problem associated with N-type dopants is to use a vapor barrier overlay described in our copending application, "Droplet Migration Using a Sealant Layer," Ser. No. 967,281, or to reduce the volatility of the N-type dopants by incorporating them in inert carrier droplets as described in our copending application, "Droplet Migration Using Carrier Droplets," Ser. No. 944,280. In this latter application, an inert carrier metal is used to carry a passenger element that can impart either an N-type or a P-type dopant characteristic to the semiconductor material. The carrier metal is selected so that it penetrates quickly and easily into the semiconductor body, it migrates quickly through the semiconductor body and it does not have a detrimental effect on the electrical properties of the epitaxial semiconductor material deposited behind the migrating droplet during temperature gradient zone melting. The final requirement is that the carrier metal and the passenger element do not react to form a stable compound. For example, aluminum was ruled out as a carrier metal for arsenic because aluminum and arsenic react to form an intermetallic compound Al-As with a reported melting point at 1700° C. Because of the formation of this stable compound, an Al(carrier) - As(passenger) droplet would not migrate but simply react to form the Al-As compound and remain on the surface of the semiconductor body. Similarly, Al(carrier) - P(passenger) droplets were not considered because of the formation of the compound AlP. Likewise, Al(carrier) - Sb(passenger) droplets was ruled out because of the formation of the compound AlSb.

This perceived inability to use aluminum as a carrier metal for the N-type dopants was unfortunate because an aluminum droplet has the best penetration ability of any carrier metal since aluminum can reduce any thin film of silicon oxide on the surface of the semiconductor body and because an aluminum droplet is the fastest migrating droplet of all the carrier metals including gold, tin, gallium, silver and indium.

Consequently, it would be desirable to be able to use aluminum as a carrier metal for at least one N-type dopant in order that N-doping could be accomplished quickly and without surface penetration problems.

An object of this invention, therefore, is to provide a new and improved method of using aluminum as a carrier droplet with an N-type dopant.

Another object of this invention is to provide a new and improved means of producing N-type regions in a body of P-type semiconductor material.

Other objects will, in part, be obvious and will, in part, appear hereinafter.

BRIEF DESCRIPTION OF THE INVENTION

We have discovered that aluminum can be used as a carrier droplet for antimony above a temperature of approximately 1065° C. The ability to use aluminum as a carrier droplet for the passenger element antimony solves the problem stated above since aluminum is both a fast migrater and a good penetrator. Moreover, the use of aluminum as a carrier for antimony is obtained without incurring any offsetting disadvantages.

In contrast to the aluminum-antimony case, the situation as perceived by the prior art is correct for aluminum (carrier) - phosphorus(passenger) droplets and for aluminum (carrier) - arsenic(passenger) droplets. Since neither of the latter combinations could be used for N-doping of silicon because of the chemical reaction and intermetallic formation between the carrier and passenger constituents of the droplet.

DESCRIPTION OF THE INVENTION

Figure 1:
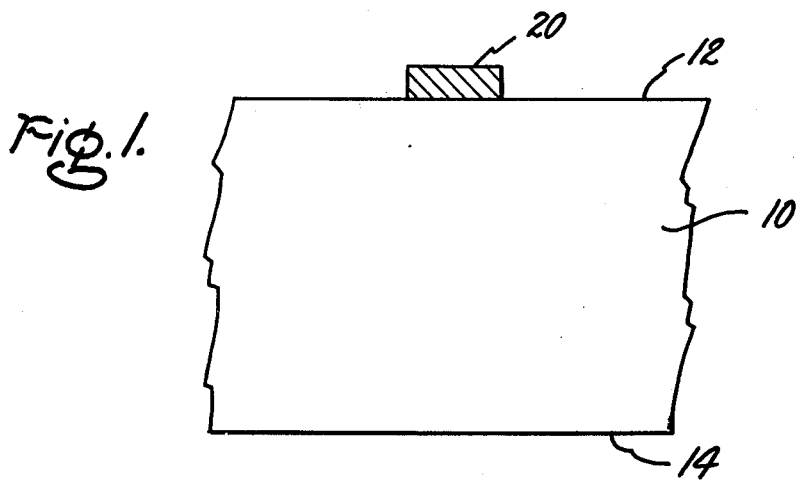
FIGS. 1-3 are side elevation views in cross-section of a body of semiconductor material processed in accordance with the teachings of this invention.

With reference to FIG. 1, there is shown a body 10 of semiconductor material having a selected resistivity and a first type conductivity. The body 10 has opposed major surfaces 12 and 14 which are the top and bottom thereof. The semiconductor material comprising body 10 may be silicon, germanium, silicon carbide, gallium arsenide, a semiconductor compound of a Group III element and a Group V element, and a semiconductor compound of a Group II element and a Group VI element.

The body 10 of silicon is mechanically polished, chemically etched to remove any damaged surfaces, rinsed in deionized water and dried in air.

The processed body is disposed in a metal evaporation chamber. A metal layer 20 comprising aluminum and from 25 to 90 atomic percent antimony is deposited on surface 12 of body 10. The thickness of layer 20 is from about ½ micron to about 25 microns in thickness.

An acid resistant second layer is then disposed over layer 20 employing well known photolithographical techniques. The second layer may comprise a substance such as Kodak Metal Etch Resist. The resist is dried by baking at a temperature of 80° C. A suitable mask outlining a droplet, a line, or grid or another suitable planar geometric figure with predetermined dimensions is disposed on the layer of photoresist and exposed to ultraviolet light. After exposure, the layer of photoresist is washed in xylene to open windows in the resist so as to be able to selectively etch away the metal first layer 20 in these regions.

Selective etching of the layer 20 is accomplished with a buffered hydrofluoric acid-nitric acid solution. The etching is continued until the layer 20 is completely removed in areas under the windows in the photoresist second layer. The processed body 10 is rinsed in deionized water and dried. The remainder of the photoresist mask is removed by immersion in concentrated sulphuric acid at 180° C. or immersion in a mixture of one part by volume hydrogen peroxide and one part per volume of sulphuric acid. The body 10 is rinsed in distilled water and blown dry with a gas such as argon, freon, or the like.

The processed body is placed in a migration apparatus, not shown, and the metal alloy layer 20 forms a melt 22 with material of the semiconductor body 10. On application of a thermal gradient to body 10, the alloy melt 22 is migrated through the body 10 by a thermal gradient zone melting process. A thermal gradient of approximately 50° C. per centimeter between the bottom surface 14, which is the hot face, and the top surface 12, which is the cold face, has been discovered to be appropriate.

Figure 4:
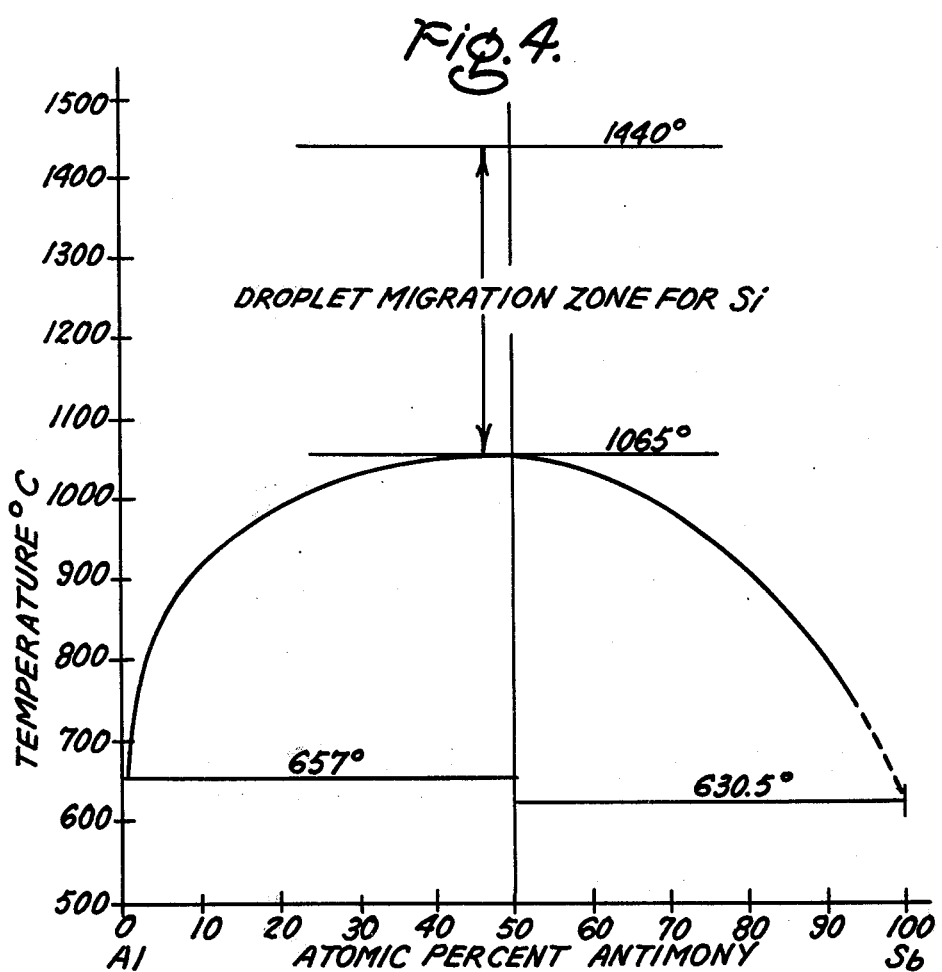
FIG. 4 is the phase diagram of the aluminum-antimony system showing the temperature range in which temperature gradient zone melting can be practiced with aluminum as a carrier droplet and antimony as a passenger element.

Unlike temperature gradient zone melting as practiced in the prior art between temperatures of 577° C. to 1440° C. in the case of aluminum droplets in silicon, it was discovered that the temperature of body 10 for aluminum(carrier) - antimony(passenger) droplets must always exceed 1070° C. Referring now to FIG. 4, the reason why the temperature must exceed 1070° C. is that below this temperature the AlSb compound is a stable solid and not a liquid droplet. In general, then for a case of reactive carrier and passenger elements that are major constituents in a droplet, the migration temperature of the semiconductor being processed by temperature gradient zone melting must exceed the melting temperature of any compound that the passenger and carrier elements may form in a reaction with each other. In addition, the migration temperature of the semiconductor being processed by temperature gradient zone melting must be less than the melting temperature of the semiconductor material. For systems in which the melting temperature of the carrier - passenger compound is less than the melting temperature of the semiconductor material being processed, temperature gradient zone melting with this particular carrier - passenger compound can be carried out. If, on the other hand, the melting temperature of the carrier - passenger compound exceeds the melting temperature of the semiconductor body e.g., the carrier - passenger compound is a solid at the melting point temperature of the semiconductor material comprising the body, temperature gradient zone melting processing will not be possible with this combination. As an example, the compound Al-As has a melting point temperature of 1700° C. and silicon has a melting point temperature of 1400° C. Therefore, Al-As cannot be processed by temperature gradient zone melting through a body of silicon semiconductor material.

Figure 2:
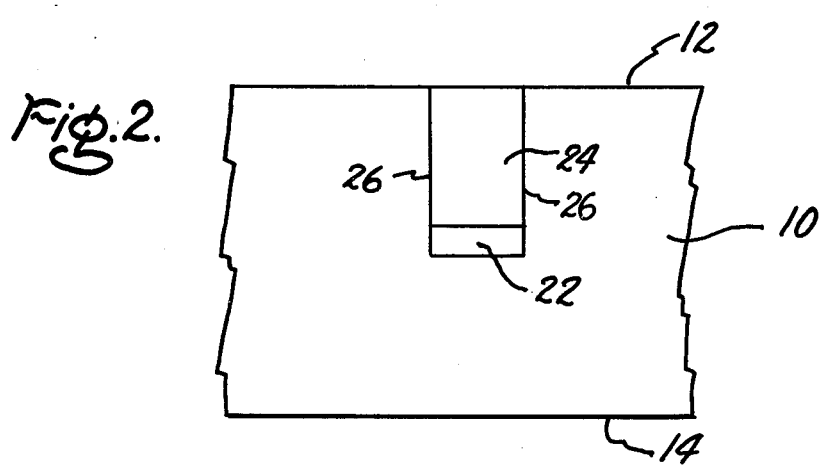

Referring again to FIG. 2, the temperature gradient zone melting is practiced for a sufficient length of time to migrate the metal droplet 22 through body 10. For aluminum is a carrier metal and antimony is a passenger element, the migration rates of liquid zones comprised of these elements is shown in the Table for a thermal gradient of 50° C. per centimeter.

TABLE

| Migration Rate of Al-Sb Droplets | Temperature |
| --- | --- |
| $4 \times 10^{-3}$ cm/sec | 1100° C. |
| $6 \times 10^{-3}$ cm/sec | 1200° C. |
| $1.5 \times 10^{-2}$ cm/sec | 1300° C. |
| $3 \times 10^{-2}$ cm/sec | 1400° C. |

Figure 3:
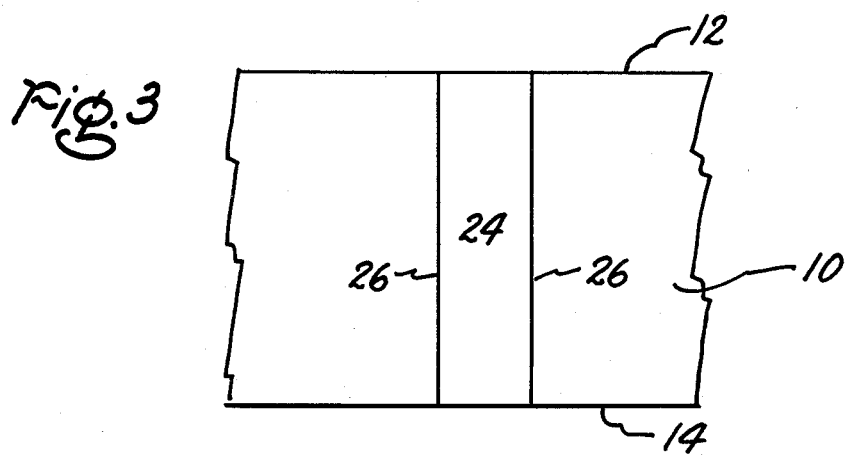

Upon completion of the temperature gradient zone melting process, the metal zone which has migrated through body 10 onto surface 14 is removed by selective etching or grinding. The resulting processed body is as shown in FIG. 3.

Figure 5:
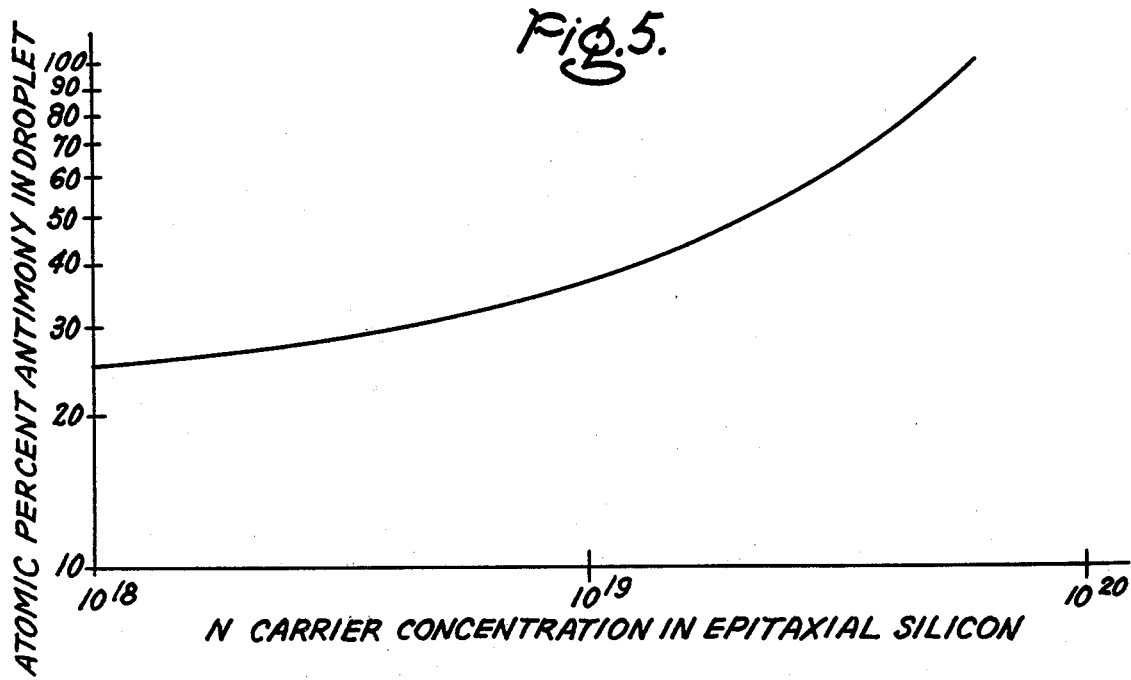
FIG. 5 is a graph of the N-carrier concentration in the epitaxial silicon material deposited behind an aluminum (carrier) - antimony(passenger) droplet as a function of the atomic percent of antimony in the droplet.

The thermal migration of the metal layer 20 through body 10 produces a region 24 of recrystallized semiconductor material containing dissolved metals of which the metal zone 20 was composed. For the case of aluminum as the carrier and antimony as the passenger element, N-type doping will only occur if the antimony concentration in layer 20 exceeds 25 atomic percent. Referring now to FIG. 5, for the case in which silicon is the semiconductor material of body 10, a plot of the N-carrier in the recrystallized region 24 is shown versus the atomic percentage composition of antimony in layer 20.

The region 24 has substantially a constant uniform concentration level of the respective impurity metals throughout the recrystallized region. The thickness in the case of a planar geometry and the diameter in the case of a columnar geometry is substantially constant for the entire region. The peripheral surface of region 24 comprises in part the top surface 12 and the bottom surface 14 of the body 10. The remaining material of body 10 is divided between regions 22. The abutting surfaces of surfaces of regions 22 and 24 form a boundary 26 which may be a P-N junction if the regions 24 and 22 are of opposite type conductivity.

The following Example illustrates the teachings of this invention:

EXAMPLE

A silicon wafer 18 mils thick and of P-type conductivity, boron doped semiconductor material having a resistivity of 10 ohm-centimeters was prepared as heretofore described with relation to body 10 for the migration of a wire. The metal wire comprised an alloy of 70 atomic percent of aluminum and 30 atomic percent of antimony. The metal wire was 10 microns thick and 250 microns wide. The prepared boy 10 was placed in a furnace heated to 1150° C.±10° C. and a thermal gradient of 50° C. per centimeter was applied to body 10. Layer 20 comprised of aluminum and antimony melted and formed a liquid melt with a portion of the semiconductor material of body 10 that it was in contact therewith. During the remainder of the 15-minute heating cycle, the molten zone 22 migrated through the body forming a recrystallized zone with an N carrier concentration of $4 \times 10^{18}$ carriers per cubic centimeters.

We claim as our invention:

1. In the method of moving a melt of metal-rich semiconductor material through a solid body of semiconductor material by thermal gradient zone melting processing comprising the steps of
   a. selecting a body of single crystal semiconductor material so that the body has a first type conductivity, a selected resistivity, and at least one major surface having a preferred planar crystal structure orientation which is one selected from the group consisting of (100), (110) and (111), the vertical axis of the body being substantially aligned with a first axis of the crystal structure;
   b. the surface having the preferred planar crystal structure orientation to accommodate one or more physical configurations of a layer of metal thereon;
   c. depositing a layer of metal on the selected surface of the body of semiconductor material;
   d. heating the body and the metal deposit to a temperature sufficient to form a melt of metal-rich material on the surface of the body;
   e. establishing a unidirectional temperature gradient along substantially the vertical axis of the body and the first axis of the crystal structure;
   f. migrating the metal-rich melt through the body along the unidirectional temperature gradient to divide the body into a plurality of regions of first type conductivity and to form at least one array of regions of recrystallized material of the body having solid solubility of the vapor deposited metal therein, the metal including at least one dopant impurity material therein to impart a predetermined second type conductivity and a selected level of resistivity thereto;

the improvement in the method of processing which includes vapor depositing a layer of metal which comprises a first material aluminum which improves the penetration of the melt, when formed, into the surface of the body and increases stability of the migration of the melt through the body, and or increases the rate of melt migration through the body, and a second material antimony which includes at least a second material which imparts to the recrystallized region predetermined electrical characteristics of conductivity type, level of resistivity, and control of lifetime and the like, and the temperature gradient zone melting is practiced at a temperature greater than 1065° C., the temperature at which intermetallic compounds are formed by the material of the semiconductor body and at least one of the first and second materials and by the first and second materials themselves.

2. The method of claim 1 wherein
the thickness of the layer of metal is from about ½ micron to about 25 microns.

3. The method of claim 1 wherein
the metal comprises at least 25 atomic percent antimony, balance aluminum.

4. The method of claim 3 wherein
the recrystallized region formed by the melt migration has N-type conductivity.

5. The method of claim 3 wherein
the metal comprises no greater than 90 atomic percent antimony, balance aluminum.

6. The method of either of the claims 1, 2, 3, 4 or 5 wherein
the semiconductor material is silicon.

* * * * *